United States Patent
Fukunaga

(10) Patent No.: US 7,134,188 B2
(45) Date of Patent: Nov. 14, 2006

(54) PARTS MOUNTING APPARATUS

(75) Inventor: Shigeki Fukunaga, Yokaichi (JP)

(73) Assignee: Murata Manufacturing Co., Ltd. (JP)

( * ) Notice: Subject to any disclaimer, the term of this patent is extended or adjusted under 35 U.S.C. 154(b) by 240 days.

(21) Appl. No.: 10/647,007

(22) Filed: Aug. 22, 2003

(65) Prior Publication Data

US 2004/0163242 A1    Aug. 26, 2004

(30) Foreign Application Priority Data

Aug. 30, 2002  (JP) ............................. 2002-252396
Jul. 15, 2003  (JP) ............................. 2003-197179

(51) Int. Cl.
*B23P 19/00* (2006.01)

(52) U.S. Cl. ............................. 29/740; 29/739; 29/743

(58) Field of Classification Search ................. 29/739, 29/740, 741, 743, 825, 832, 833
See application file for complete search history.

(56) References Cited

U.S. PATENT DOCUMENTS

| | | | | |
|---|---|---|---|---|
| 4,881,319 A | * | 11/1989 | Yagi et al. ..................... | 29/840 |
| 5,084,962 A | * | 2/1992 | Takahashi et al. ............ | 29/833 |
| 5,177,528 A | | 1/1993 | Koromegawa et al. | |
| 5,379,514 A | * | 1/1995 | Okuda et al. ................. | 29/833 |
| 5,502,890 A | * | 4/1996 | Gunter ......................... | 29/833 |
| 6,119,337 A | * | 9/2000 | Furuno ......................... | 29/832 |
| 6,446,333 B1 | * | 9/2002 | Kashiwagi et al. ........... | 29/833 |

FOREIGN PATENT DOCUMENTS

| | | |
|---|---|---|
| JP | 2780000 | 5/1998 |
| JP | 2811856 | 8/1998 |
| JP | 11-138367 A | 5/1999 |
| JP | 2000-269241 | 9/2000 |
| JP | 2001-230596 | 8/2001 |

OTHER PUBLICATIONS

Chinese Office Action issued Jun. 10, 2005 with English language translation and Japanese translation.
Korean Office Action issued Jun. 30, 2005 with English language translation.

* cited by examiner

*Primary Examiner*—Carl J. Arbes
(74) *Attorney, Agent, or Firm*—Ostrolenk, Faber, Gerb & Soffen, LLP

(57) ABSTRACT

A suction head is inserted between first and second cameras relatively disposed facing one another with aligned optical axes, so that the first camera takes images of a head reference mark on the suction head, and the second camera of a first part suctioned to the suction head. Next, a stage is inserted between the first and second cameras so that the first camera takes images of a second part held on the stage, and the second camera of a stage reference mark thereupon. The relative positions between the first part and the suction head, and between the second part and the stage, are calculated based upon image information from the cameras, and the suction head and the stage are positioned, the first and second parts being relatively positioned based upon positional information and relative positional information from the first and second cameras, and mounting is performed.

5 Claims, 15 Drawing Sheets

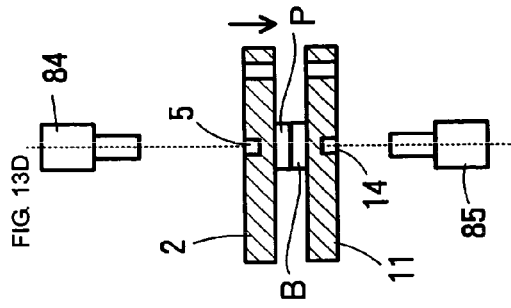
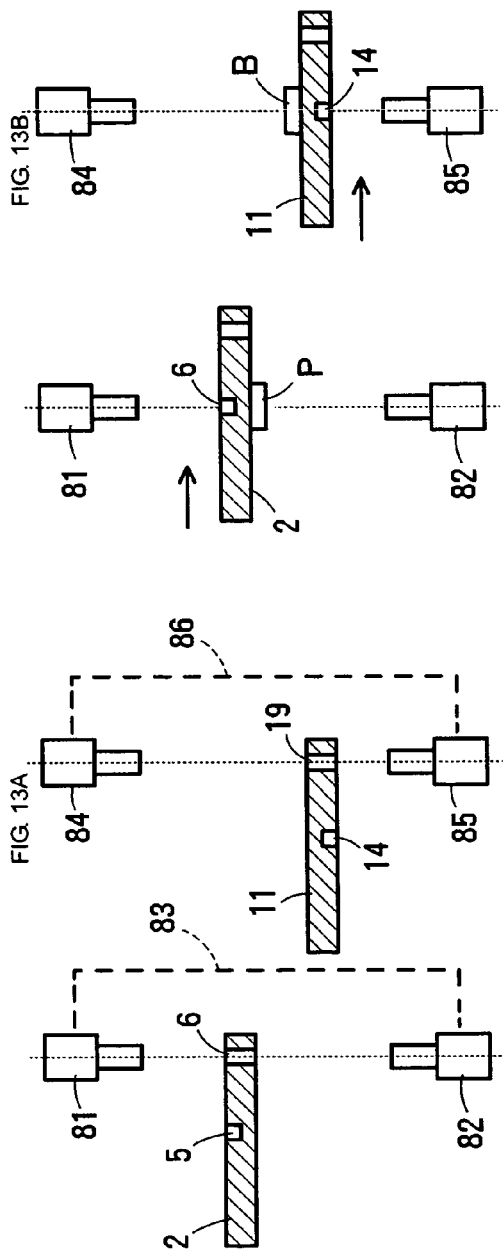
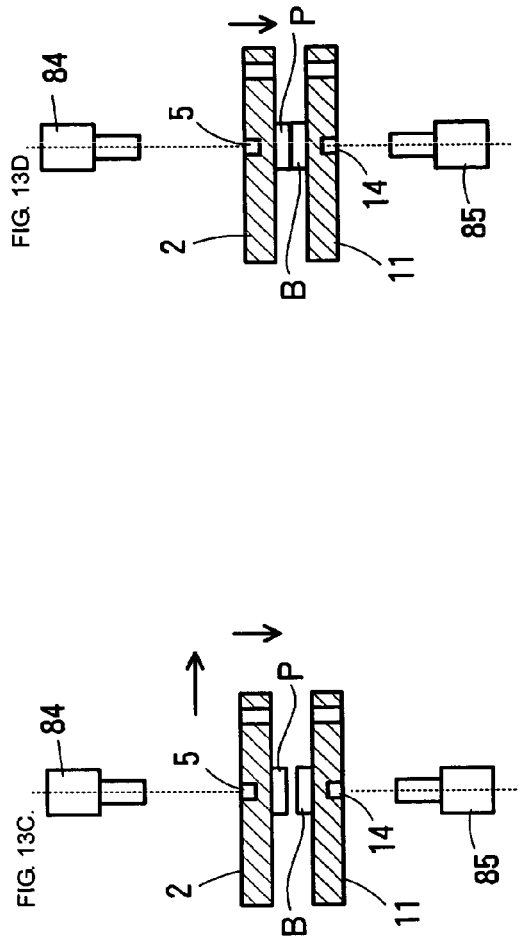

PARTS MOUNTING APPARATUS

BACKGROUND OF THE INVENTION

1. Field of the Invention

The present invention relates to a parts mounting method and parts mounting apparatus, used for mounting electronic parts onto a board or the like.

2. Description of the Related Art

Conventionally, for mounting electronic parts such as semiconductor chips, piezoelectric devices, or the like, on a board such as a printed board, a positioning mechanism with high precision is necessary for mounting such electronic parts at predetermined positions on the board.

Such a positioning mechanism is disclosed in Japanese Patent No. 2,780,000 and another mechanism is disclosed in Japanese Patent No. 2,811,856. With the mechanism disclosed in Japanese Patent No. 2,780,000, two cameras take images of a specific mark from above and from below, respectively, so as to detect the offset between a workpiece and a board, and correction is performed for the relative movement amount between the workpiece and the board based upon the detected offset. On the other hand, Japanese Patent No. 2,811,856 discloses a method wherein cameras are inserted into a position on a line formed between the board and an electronic part for taking images upward and downward at the same time, i.e. a method wherein back-to-back cameras take images upward and downward at the same time.

However, with the positioning mechanism disclosed in the Japanese Patent No. 2,780,000, an axial mechanism with highly-precise repeatability is necessary for moving the workpiece and the board, and furthermore, the offset between the workpiece and the board cannot be detected at the time of bonding. Furthermore, correction using the specific mark is performed for detecting the relative positional offset between the upper camera and the lower camera, and accordingly, the margin of error with regard to the distance between the upper camera and the bonding unit due to thermal expansion or the like, and the margin of error with regard to distance between the lower camera and the bonding stage due to thermal effects or the like, cannot be detected, and consequently, there is a limit to the amount of improvement of precision that is available with regard to bonding.

On the other hand, with the mechanism disclosed in Japanese Patent No. 2,811,856, the back-to-back cameras are inserted into a position in alignment with the workpiece and the board so as to detect the offset therebetween, and accordingly, there is the need to retract the back-to-back cameras to one side from this position in the alignment at the time of bonding, so the positions of the workpiece and the board cannot be detected at the time of mounting. Furthermore, since the cameras have back-to-back fields of view, the cameras cannot have the same field of view in principle for taking an image of a single calibration mark, leading to the problem that the positioning of these two cameras requires a complex operation.

SUMMARY OF THE INVENTION

Accordingly, the present invention provides a parts mounting method and a parts mounting apparatus, wherein highly-precise positioning can be made with a configuration employing a low-cost movement mechanism for moving parts, the positions of a head and a stage can be detected during mounting, and correction can be performed for the margin of error due to deformation of the head or stage, or the like.

To this end, a parts mounting method, wherein a first part is suctioned by a suction head, and positioning is performed so as to mount the first part onto a second part held by a stage, comprises the following steps: preparing a first optical system with an optical axis directed toward the suction head from above, and a second optical system with an optical axis directed generally facing the optical axis of the first optical system, from below the stage; inserting the suction head between the first optical system and the second optical system so that the first optical system takes an image of a head reference mark provided to the suction head, which can be observed from above, and so that the second optical system takes an image of the first part suctioned to the suction head; inserting the stage between the first optical system and the second optical system so that the first optical system takes an image of the second part held on the stage, and so that the second optical system takes an image of a stage reference mark provided to the stage, which can be observed from below; calculating the relative position between the first part and the suction head, and the relative position between the second part and the stage, based upon image information from the first and second optical systems; detecting the head reference mark and the stage reference mark by the first and second optical systems with the suction head and the stage being positioned at the mounting position, and performing positional correction for at least one of the suction head and stage so that the positions of the first part and the second part satisfy a predetermined relation using the detected positional information and the relative positional information; and performing mounting for the first part and the second part following the positional correction.

Further, a parts mounting apparatus, for positioning and mounting a first part on a second part, comprises: a suction head, having a head reference mark which can be observed from above, for suctioning the first part at the lower end portion thereof; a stage, having a stage reference mark which can be observed from below, for holding a second part at the upper end thereof; a driving mechanism for relatively moving the suction head and the stage in the X, Y, Z, and θ directions; a first optical system for taking images of the second part held by the stage, and the head reference mark, from above the suction head; a second optical system, disposed so as to generally face the first optical system with the optical axis thereof aligned with the optical axis of the first optical system, for taking images of the first part suctioned to the suction head, and the stage reference mark, from below the stage; a computation device for calculating the relative position between the first part and the suction head, and the relative position between the second part and the stage, based upon image information from the first and second optical systems; and a control device for performing positional correction for the suction head and the stage so that the positions of the first part and the second part satisfy a predetermined relation based upon above-described relative positional information and positional information from the first and second optical systems detecting the head reference mark and stage reference mark with the suction head and stage being positioned at the mounting position. Such an apparatus allows the above parts mounting method to be carried out with a simple apparatus configuration.

Description will now be made regarding an example of the parts mounting method. First of all, with the example, a first optical system and a second optical system are employed. Note that the optical system may include not only a camera main unit, but also may include mirrors or lenses, and furthermore, the optical system is not restricted to an optical system including a single camera, but rather, an arrangement may be made wherein two optical system include a single camera, or an arrangement may be made wherein an optical system includes multiple cameras.

The first optical system is disposed above a suction head, facing downwards, and the second optical system is disposed below a stage, facing upwards. The first optical system and the second optical system are disposed facing one another with generally aligned optical axes, and in a known positional relation. With the first optical system and the second optical system facing one another with generally aligned optical axes, each optical system should be disposed so that the optical axis is in the range of the field of view of the other optical system. In the event that the size of one of a first part and a second part, which are to be mounted, is greater than the assumed viewing field, the first optical system and the second optical system should be integrally moved in the horizontal direction.

Next, the suction head is inserted between the first optical system and the second optical system, so that the first optical system takes an image of a head reference mark which is provided to the suction head, and can be observed from above, and so that the second optical system takes an image of the first part suctioned to the suction head. The first optical system and the second optical system are disposed facing one another, with generally aligned axes, and accordingly, the relative position between the suction head and the first part can be obtained based upon the image data from these two optical systems. Note that the arrangement wherein the suction head is inserted between the first optical system and the second optical system is not restricted to that wherein the first and second optical systems are fixed and the suction head is moved, but an arrangement may be made wherein the suction head is fixed, and the first and second optical systems are moved.

Next, the stage is inserted between the first optical system and the second optical system, so that the first optical system takes an image of the second part held on the stage, and so that the second optical system takes an image of a stage reference mark which is provided to the stage and can be observed from below. In this case, the relative position between the stage and the second part can be obtained based upon the image data from these two optical systems in the same way as described above. Note that the arrangement wherein the stage is inserted between the first optical system and the second optical system is not restricted to that wherein the first and second optical systems are fixed and the stage is moved, but an arrangement may be made wherein the stage is fixed and the first and second optical systems are moved.

Note that the step wherein the relative position between the suction head and the first part is obtained, and the step wherein the relative position between the stage and the second part is obtained, may be performed in any order. Furthermore, the head reference mark is preferably provided at a position as close as possible to the first part suctioned to the suction head, and the stage reference mark is preferably provided at a position as close as possible to the second part. Furthermore, in a case of taking images of the first part and the second part, an arrangement may be made wherein alignment marks have been applied to these parts beforehand, or an arrangement may be made wherein the position of the part is detected by taking an image of a characterizing point (e.g., edge or the like) of the part.

Next, the relative position between the first part and the suction head, and the relative position between the second part and the stage, are calculated based upon image information from the first optical system and the second optical system. That is to say, the position of the suction head (head reference mark) is detected based upon the image information from the first optical system, and the position of the first part is detected based upon the image information from the second optical system, whereby the relative position between the first part and the suction head can be calculated. Furthermore, the position of the second part is detected based upon the image information from the first optical system, and the position of the stage (stage reference mark) is detected based upon the image information from the second optical system, whereby the relative position between the second part and the stage can be calculated.

Next, positional correction is performed for the suction head and the stage so that the positions of the first part and the second part satisfy a predetermined relation based upon the above-described relative positional information and positional information from the first and second optical systems detecting the head reference mark and the stage reference mark with the suction head and the stage being positioned at the mounting position. Mounting is performed for the first part and the second part in this situation, and thus, mounting can be performed with the first part and the second part being positioned in a highly-precise manner without positional deviation one from another.

With the parts mounting method according to the present invention, positional correction is performed during mounting while taking images of the reference marks provided to both the head and the stage, and accordingly, the axial mechanism only needs to have only sufficient positional resolution, and does not require highly-precise repeatability. Thus, a low-cost axial mechanism can be employed. Furthermore, the margin of error with regard to repeatability due to thermal expansion or lost motion can be corrected during mounting. As a result, the present invention can be applied even to mounting of electronic parts that require positional precision on the order of submicrons.

There is no need to hold the first and second optical systems in a fixed positional relation at all times, but the positions of the first and second optical systems should satisfy a known relation at least while taking images. For example, an arrangement may be made wherein any of the optical systems are temporarily retracted at the time of inserting the head or the stage, following which the retracted optical system is returned. In this case, there is the need to employing a movement mechanism of the optical system having repeatability.

Furthermore, positioning can be performed while the first and second optical systems take images, so the offset between the first and second parts can be detected during mounting. Accordingly, even in the event that thermal deformation of the head or stage occurs due to heat from the heater at the time of bump-bonding process, for example, the thermal deformation is detected in real time so that positional correction is performed for the first and second parts, and thus, positioning can be performed with high precision even under heating.

The head reference mark according to the present invention is not restricted to a particular type of mark such as a colored mark, a protrusion, a recessed portion, or the like, specifically provided to the suction head, but rather, a part of the head, such as the edge thereof, can be used as a head reference mark. In the same way, the stage reference mark according to the present invention is not restricted to a particular type of mark specifically provided to the stage, but rather, a part of the stage, such as the edge thereof, can be used as a stage reference mark.

Note that the term "position" according to the present invention is generally used for the position in the X, Y, and Z directions, and the attitude in the θ direction. Accordingly, the term "position" encompasses the attitude.

The parts mounting method may further comprise a step wherein a single calibration mark, which can be observed from both above and below, is inserted between the first optical system and the second optical system so that both the first optical system and the second optical system take images of the calibration mark, thereby determining an offset of the optical axes of the first optical system and the second optical system.

Even in the event that the first optical system and the second optical system have been adjusted beforehand so as to face one another with aligned optical axes in a precise manner, occurrence of the offset of the optical axes cannot be avoided due to passing of time or change in temperature, and furthermore, it is difficult to keep highly-precise positional resolution on the order of submicrons. Accordingly, with this arrangement, both the first optical system and the second optical system detect a single mark from the upper side and the lower side so as to obtain the offset of the optical axes of both the optical systems, the relative position between the first part and the suction head and the relative position between the second part and the stage are calculated, and furthermore, positional correction is performed for the suction head and the stage, and accordingly addition of the margin of error does not occur, thereby enabling positioning with high precision.

Note that while calibration should be preferably performed for each time of mounting in order to perform positioning with the highest precision, an arrangement may be made wherein calibration is performed once every predetermined number of times of mounting, or for once every predetermined time period.

Also, the calibration mark may be provided to the suction head or the stage. While the calibration mark may be provided to a member other than the suction head and the stage, however, in this case, a movement mechanism is necessary for inserting and retracting this member, leading to complex configuration of the apparatus. Accordingly, with this arrangement, the calibration mark is provided to the suction head or the stage, and accordingly, there is no need to provide a member other than the head and stage for calibration, and thus the arrangement has the advantage of simple configuration.

Note that there is a need to observe the calibration mark from the upper and lower optical systems at the same time. Accordingly, with the present arrangement, a vertical through hole provided to the suction head or the stage; however, a mark provided on a transparent member (e.g., glass plate), or the like, can be employed as a calibration mark.

An arrangement is preferably employed wherein the first optical system and the second optical system are held in the fixed positional relation during the step wherein images of the head reference mark and the first part are taken, the step wherein images of the second part and the stage reference mark are taken, the step wherein positional correction is performed for at least one of the suction head and the stage, and the step wherein mounting is performed for the first part and the second part. That is to say, these optical systems are preferably held so that the offset of the optical axes of the optical systems does not occur during all the steps for positioning.

As described above, with the present arrangement, positional detection is performed by the first and second optical systems facing one another, with the fixed relative position therebetween at all times, there is little influence of the margin of error due to the movement mechanism as compared with this arrangement, wherein the optical systems are separately moved, and thus, positioning can be performed with improved precision, and furthermore, there is no need to provide a highly-precise movement mechanism.

The positional correction step for the suction head and the stage at the mounting position may include a step wherein the first and second optical systems continuously take images of the head reference mark and the stage reference mark while heating one or both of the suction head and the stage, with correction being performed with regard to the relative position between the suction head and the stage so that the positions of the first part and the second part satisfy predetermined relation based upon the above-described relative positional information.

In this case, the offset between the marks corresponding to thermal deformation is continuously detected during mounting, and accordingly, even in the event that thermal deformation occurs, positional correction can be made in real time, and thus, mounting can be performed for the first part and the second part with high precision at all times.

At least of the suction head and the stage may comprise a part-suction opening, a hollow portion which is provided behind a back side of the part-suction opening and communicates with the part-suction opening, a transparent member which closes the end opposite the part-suction opening of the hollow portion, where the part-suction opening can be observed from the back side, and an air suctioning path which is connected to the hollow portion, with at least one of the first optical system and the second optical system detecting the part-suction opening as a head reference mark or a stage reference mark through the transparent member.

That is to say, the part-suction opening is provided for suctioning the first part or the second part, and is disposed at the position closest to that part. Accordingly, even in the event that thermal deformation of the suction head or the stage occurs, the relative positional offset between the part and the head (or stage) is reduced to the minimal value.

Furthermore, with this arrangement, the part-suction opening serving as a reference mark can be observed from the back side of the head (or stage) through the transparent member, and accordingly, the optical system can easily take images of the part-suction opening from the back side of the head (or stage) even during mounting. That is to say, precise position of the head (or stage) can be detected during mounting, thereby enabling positioning with high precision.

Also, a heater may be fixed near the part-suction opening. In some cases, bonding is performed under heat and pressure at the time of mounting the first part and the second part. In this case, the heater is preferably provided at the position closest to the part, i.e., a position near the part-suction opening, and accordingly, heat is transmitted to the part with optimal efficiency, thereby improving bonding performance.

Note that in a case of heating the head (or stage), distortion occurs in the image taken from the optical system due to wavering of surrounding air, leading to occurrence of margin of error. However, with the suction head or the stage having the previous configuration having a part-suction opening, although the hollow portion is heated by the heater, the hollow portion is subjected to reduction of pressure by air suctioning from the air suctioning path, and accordingly, the density of air is reduced, whereby occurrence of wavering of air is reduced. Thus, at the time of taking an image of the part-suction opening through the transparent member and the hollow portion, the margin of error due to the wavering of air is reduced, thereby obtaining precise image data.

Further, the back face of the suction head or the stage is preferably mounted to the driving mechanism by a bracket including a hollow portion whereby the first or second optical system can be inserted for taking images of said part-suction opening through the transparent member.

While the head (or stage) is driven in the X, Y, Z, and θ directions by the driving mechanism, in the event that the head is supported by the driving mechanism by a cantilever configuration, the back side of the transparent member is opened, and thus, layout of the camera, mirror, or the like, on the back side of the transparent member can be easily performed. However, deformation of the head can occur with the cantilever configuration due to the pressure applied at the time of bonding of the first part and the second part, leading to difficulty in high-precision bonding. On the other hand, in the case that the head is supported at the back side thereof by the driving mechanism or the like by a bracket, even in the event that the bracket is subjected to application of pressure, deformation of the bracket hardly occurs, thereby enabling bonding with high precision. However, it is difficult to dispose the camera or the like on the back side of the transparent member due to interference with the bracket. Accordingly, with this arrangement, the head is supported through a bracket having a hollow portion on the back side of the head, in particular, on the back side of the transparent member, and accordingly, interference does not occur between the camera and the bracket, whereby images of the part-suction opening can be easily taken, and also the head (or stage) can be supported by the driving mechanism in a stable manner.

Note that the optical system according to the present invention encompasses not only a camera but also portions having functions wherein images are reflected toward the camera using mirrors or prisms. Accordingly, an arrangement may be made wherein only optical parts like mirrors, prisms or lens other than the camera are inserted into the hollow portion.

Other features and advantages of the present invention will become apparent from the following description of embodiments of the invention which refers to the accompanying drawings.

BRIEF DESCRIPTION OF THE DRAWINGS

FIGS. 8A and 8B are enlarged diagrams of the suction head of the mounting apparatus shown in FIG. 6, wherein FIG. 8A is an elevational view thereof, and FIG. 8B is a cross-sectional view taken along line VIII—VIII in FIG. 8A;

FIGS. 9A and 9B are enlarged diagrams illustrating a part-suction opening provided to the suction head as viewed from the back side, wherein FIG. 9A is an elevational view thereof, and FIG. 9B is a cross-sectional view taken along line IX—IX in FIG. 9A;

FIGS. 13A through 13D are operational explanatory diagrams for describing the mounting apparatus shown in FIG. 12.

DESCRIPTION OF EMBODIMENTS OF THE INVENTION

First Embodiment

Figure 1:
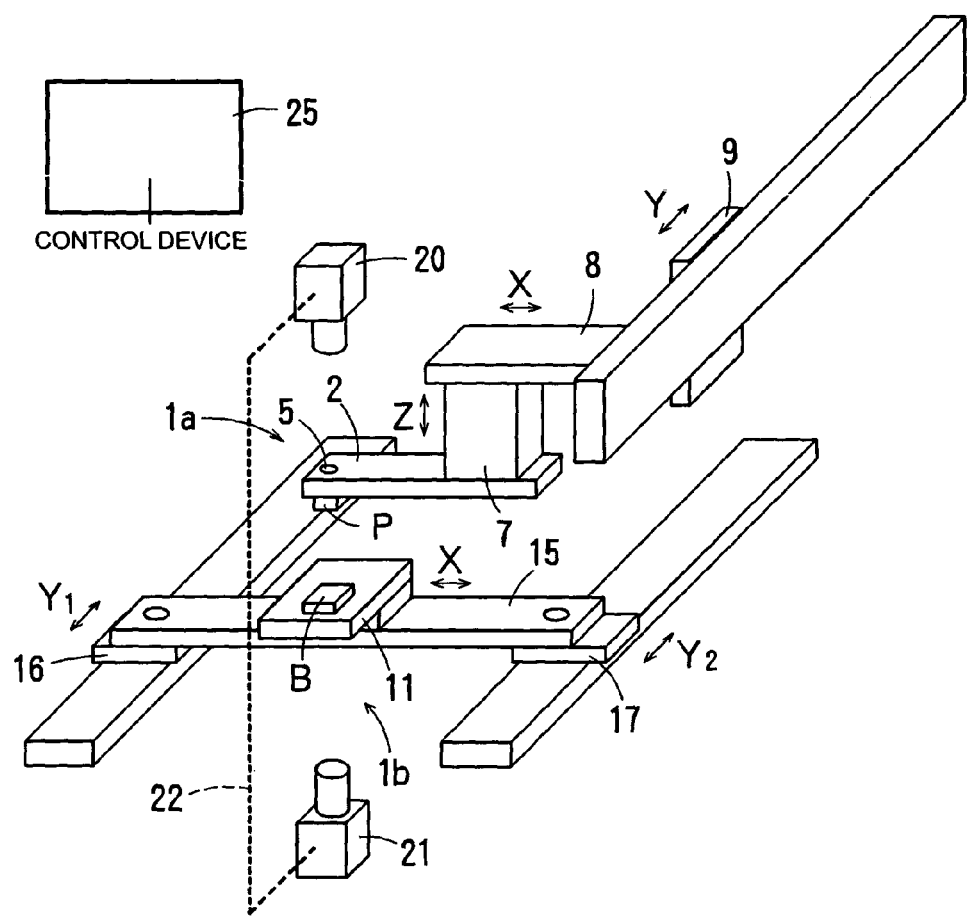
FIG. 1 is a perspective view of a mounting apparatus employing a parts mounting method of a first embodiment according to the present invention.
Figure 2:
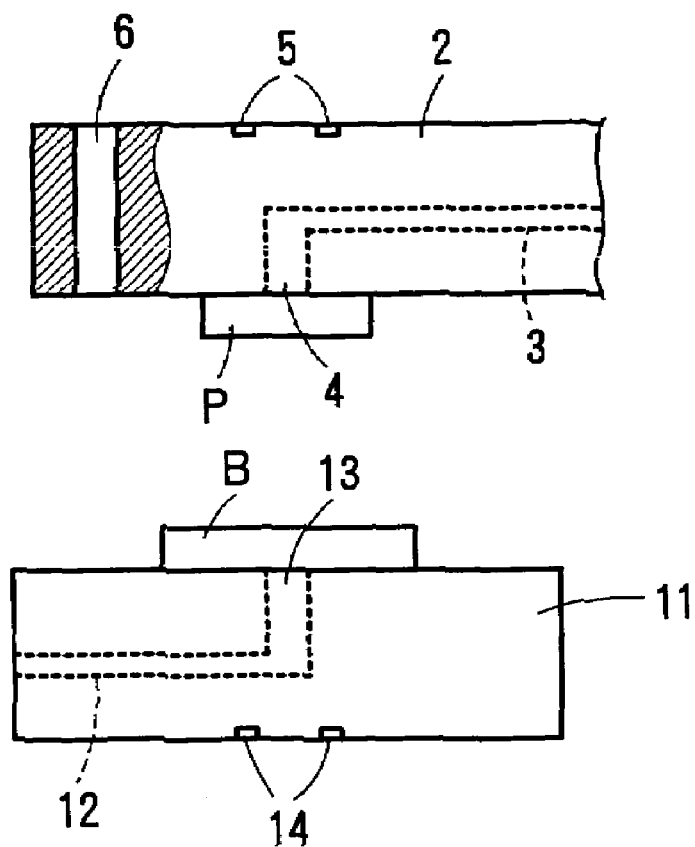
FIG. 2 is an enlarged view of a suction head and a stage of the mounting apparatus shown in FIG. 1.
Figure 3:
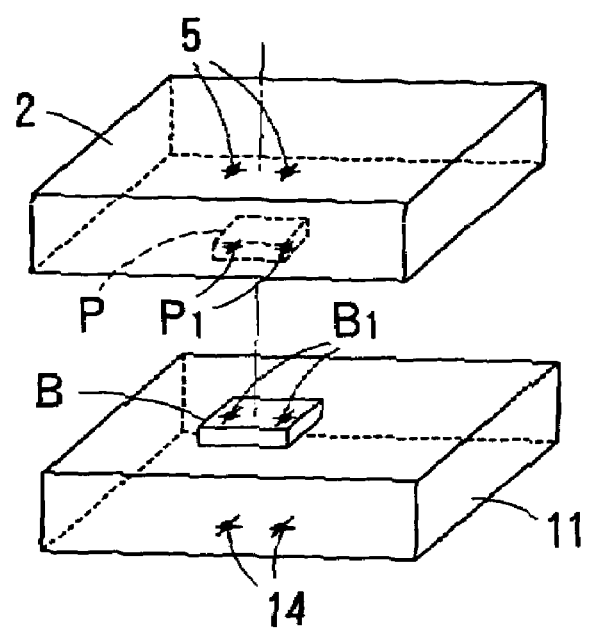
FIG. 3 is a perspective view of the suction head and the stage shown in FIG. 1.

FIGS. 1 through 3 illustrate a mounting apparatus employing a parts mounting method of a first embodiment according to the present invention. Here, an electronic part P and a board B are employed as a first part and a second part, respectively. The mounting apparatus of the present embodiment comprises a head unit 1a, a stage unit 1b, first and second cameras 20 and 21, and a control device 25.

The head unit 1a includes a suction head 2 for suctioning the electronic part P, and driving mechanisms 7, 8, and 9 for driving the suction head 2 in the X, Y, and Z directions. As shown in FIG. 2, the suction head 2 includes an unshown vacuum suction device and a suction hole 3 connected to the vacuum suction device, wherein a part-suction opening 4 is provided for suctioning the electronic part P by forming an opening on the lower face at the tip of the suction hole 3.

A head reference mark 5 is provided at a position on the upper face of the suction head 2, in particular, at a position generally corresponding to the part-suction opening 4. For serving as the head reference mark 5, an arrangement may be made wherein multiple dot-shaped marks are formed for detecting the repeatability in the θ direction as shown in FIG. 3. Furthermore, the head reference mark 5 may be formed in a directive shape (e.g., a rectangle or the like).

On the other hand, the electronic part P also has an alignment mark P1 corresponding to the reference mark 5. The alignment mark P1 is not restricted to a specific mark such as a dot-shaped mark, but rather, an arrangement may be made wherein a characterizing feature such as the edge of the electronic part P is used as the alignment mark P1.

The suction head 2 has a calibration mark 6 at the tip thereof (FIG. 2) for detecting the offset of the optical axes of the first camera 20 and the second camera 21, described later. The calibration mark 6 can be detected from both the upper and lower directions, with the calibration mark being formed of a through hole in the vertical direction.

Note that an arrangement may be made wherein the suction head 2 includes heating means for heating the electronic part P.

The suction head 2 is mounted on the X-axial driving mechanism 8 through the Z-axial driving mechanism 7, and furthermore, the X-axial driving mechanism 8 is connected to the Y-axial driving mechanism 9. Thus, the suction head 2 can be moved to any arbitrary position in the X-axial, Y-axial, and Z-axial directions. The suction head 2 can suction the electronic part P at an unshown supplying position, and can transport the electronic part P to the mounting position so as to mount the electronic part onto the board B.

The stage unit 1b includes a stage 11 for holding the board B, and driving mechanisms 15, 16, and 17 for driving the stage 11 in the X, Y, and θ directions. As shown in FIG. 2, the stage 11 also includes a suction hole 12 connected to an unshown vacuum suction device, and a part-suction opening 13 in the form of an opening formed on the upper face at the end of the suction hole 12 for suctioning and holding the board B. A stage reference mark 14 is provided on the lower face of the stage 11, in particular, at the back position generally opposite to the part-suction opening 13. For serving as the reference mark 14, an arrangement may be made wherein multiple dot-shaped marks are formed as shown in FIG. 3, or an arrangement may be made wherein a mark is formed in a directive form (e.g., rectangle or the like), in the same way as with the head reference mark 5. Furthermore, an alignment mark B1 is provided on the board B corresponding to the reference mark 14, as well.

Note that heating means may be provided to the stage 11 for heating the board B.

The stage 11 is mounted on the X-axial driving mechanism 15, wherein the two end portions thereof are respectively connected to the Y1-axial driving mechanism 16 and the Y2-axial driving mechanism 17 through hinges or the like. The Y1-axial driving mechanism 16 and the Y2-axial driving mechanism 17 are movable independently from one another, whereby the stage 11 can be adjusted with regard to angle in the θ direction. Thus, the stage 11 can be moved to any arbitrary position in the X, Y, and θ directions. The stage 11 has functions for receiving the board B at an unshown supplying position, and transporting the board B to the mounting position.

The first camera 20 and the second camera 21 are mounted above the suction head 2 and below the stage 11, respectively. The cameras 20 and 21 face one another with the optical axes thereof generally matching one another, and the relative positions thereof are held by a suitable positioning arrangement 22 such as a motor axis so that the cameras are not relatively moved. Note that, while both the cameras preferably include autofocus functions, an arrangement may be made instead wherein both the camera 20 and 21 can be moved in the Z axis direction, making the autofocus functions unnecessary. In order to detect any offset of the optical axes of the first camera 20 and the second camera 21, the calibration mark 6 provided to the suction head 2 is used. Note that an opening or mark formed on the stage 11 could also be used as a calibration mark, or a member other than the suction head 2 and the stage 11 could be used as a calibration mark.

The control device 25 acquires image data from the first camera 20 and the second camera 21. From the acquired image data, the control device computes the offset of the optical axes of the first camera 20 and the second camera 21, the position (attitude) of the electronic part P, the position (attitude) of the board B, the relative position (attitude) between the head reference mark 5 and the electronic part P, the relative position (attitude) between the stage reference mark 14 and the board B, and the like, stores the calculated results, and controls the driving mechanisms 7, 8, 9, 15, 16, and 17.

Figure 4:
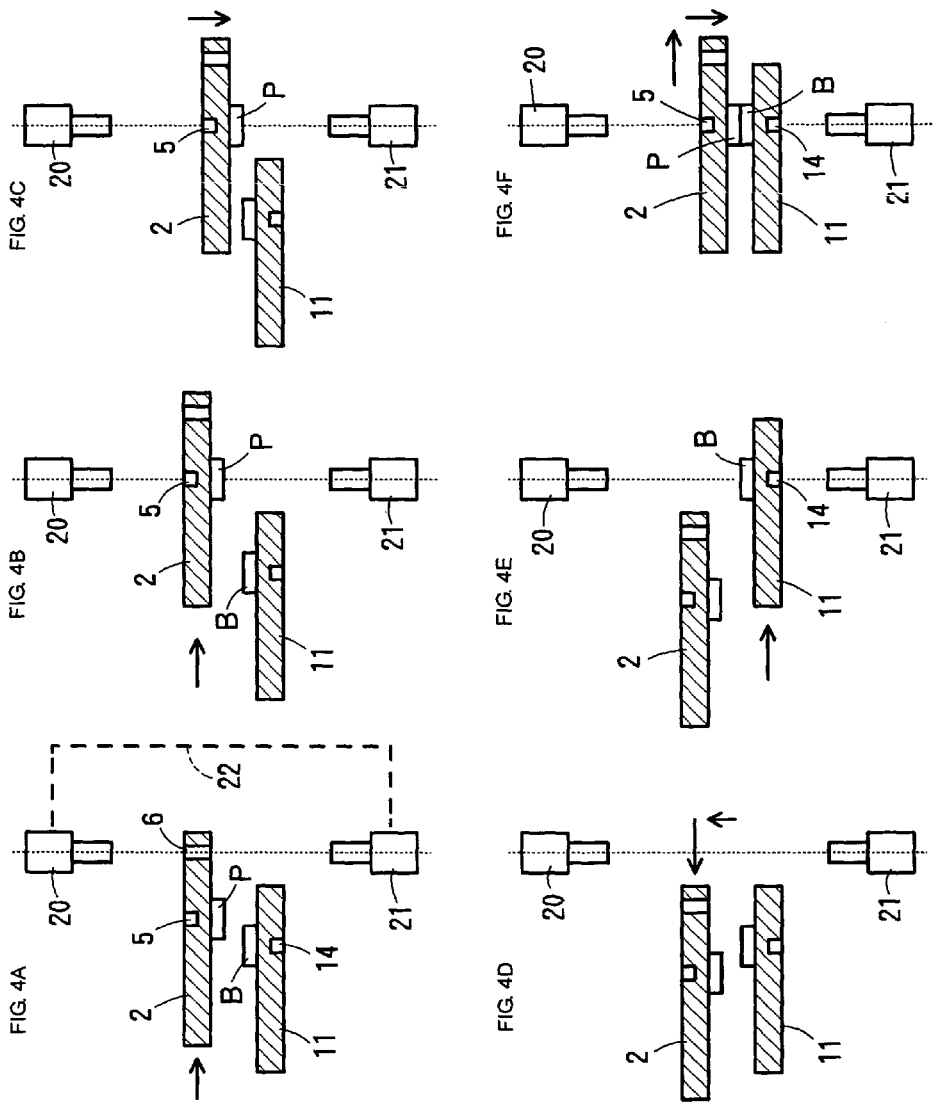
FIGS. 4A through 4F are operational explanatory diagrams for describing a position-matching operation for the mounting apparatus shown in FIG. 1.

Here, description will be made regarding an example of the operation of the mounting apparatus having the above-described configuration with reference to FIGS. 4A through 4F. FIG. 4A shows calibration processing for the first camera 20 and the second camera 21. First of all, the tip of the suction head 2 is inserted between the first camera 20 and the second camera 21, disposed at the mounting positions, and images of the calibration mark 6 provided to the suction head 2 are taken by both the cameras 20 and 21 so as to obtain the offset of the optical axes of the cameras 20 and 21. The offset of the optical axes is used for calculating the relative position between the electronic part P and the suction head 2, for calculating the relative position between the board B and the stage 11, for performing correction of the positions of the suction head 2 and the stage 11, and the like, described later. FIG. 4B shows the state wherein the electronic part P suctioned by the suction head 2 is inserted to a position between the cameras 20 and 21, i.e., the mounting position. FIG. 4C shows the state wherein the suction head 2 is moved downwards to a mounting level, wherein the first camera 20 detects the head reference mark 5, and the second camera 21 detects the electronic part P (alignment mark P1). Subsequently, the position (attitude) of the electronic part P and the relative position (attitude) between the electronic part P and the suction head 2 are calculated based upon the image information from the first camera 20 and the second camera 21, and the calculated results are stored.

FIG. 4D shows the state wherein the suction head 2 is retracted to one side from the mounting position. FIG. 4E shows the state wherein the stage 11 is inserted to the mounting position, i.e., the position where the board B on the stage 11 can be detected by the first camera 20, and the reference mark 14 on the back of the stage 11 can be detected by the second camera 21. At this position, the first camera 20 detects the board B (alignment mark B1), and the second camera 21 detects the stage reference mark 14. Subsequently, the position (attitude) of the board B and the relative position (attitude) between the board B and the stage 11 are calculated based upon the image information from the first camera 20 and the second camera 21, and the calculated results are stored. At this time, correction is performed for the position of the board B so that the position of the board B matches the position of the electronic part P obtained in the state shown in FIG. 4C.

Note that the focal distances of the first camera 20 and the second camera 21 shown in the state in FIG. 4E are different from the focal distances at the time of detecting the calibration mark 6 (see FIG. 4A), respectively, and accordingly, both the cameras 20 and 21 preferably have autofocus functions so as to clearly detect the alignment mark B1 and the stage reference mark 14.

FIG. 4F shows mounting processing, wherein the suction head 2 is moved to the same position as in the state shown in FIG. 4C while keeping the stage 11 at the same position as in FIG. 4E, and the electronic part P is mounted on the board B.

In the event that following detection of the position of the electronic part P as shown in FIG. 4C, the cameras are moved to one side from the mounting position as shown in FIG. 4D, and furthermore, the cameras are returned to the mounting position as shown in FIG. 4F, the electronic part P might not be able to be returned to the mounting position shown in FIG. 4C with suitable repeatability depending upon precision of the driving mechanisms 7, 8, and 9. Furthermore, the field of view of the second camera 21 is interrupted by the stage 11, and accordingly, the second camera 21 cannot directly detect the electronic part P. Accordingly, in the mounting processing, the first camera 20 detects the head reference mark 5, and the suction head 2 is moved in the X and Y directions so that the position of the electronic part P matches that shown in FIG. 4C based upon the relative positional data calculated in processing shown in FIG. 4C. The stage 11 is kept at the same position shown in FIG. 4E. That is the position of the stage 11 at the time of mounting is not offset from that shown in FIG. 4E, and accordingly, correction should be performed for only the position of the electronic part P. Note that in the event that offset occurs in the θ direction, the stage 11 should be moved in the θ direction. As described above, precise positioning can be performed for the electronic part P and the board B, and accordingly, mounting can be made with high precision, thereby enabling high-precision products to be manufactured.

Figure 5:
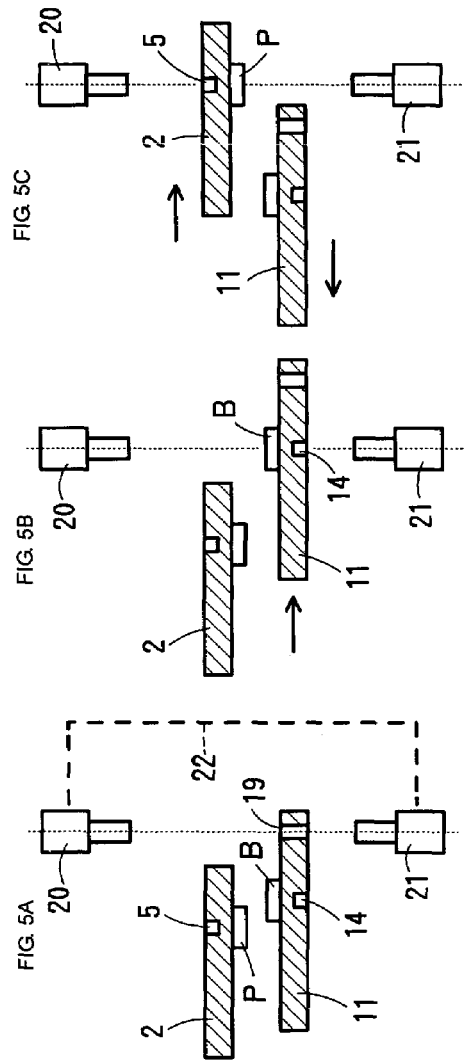
FIGS. 5A through 5F are operational explanatory diagrams for describing another position-matching operation for the mounting apparatus shown in FIG. 1.
Figure 6:
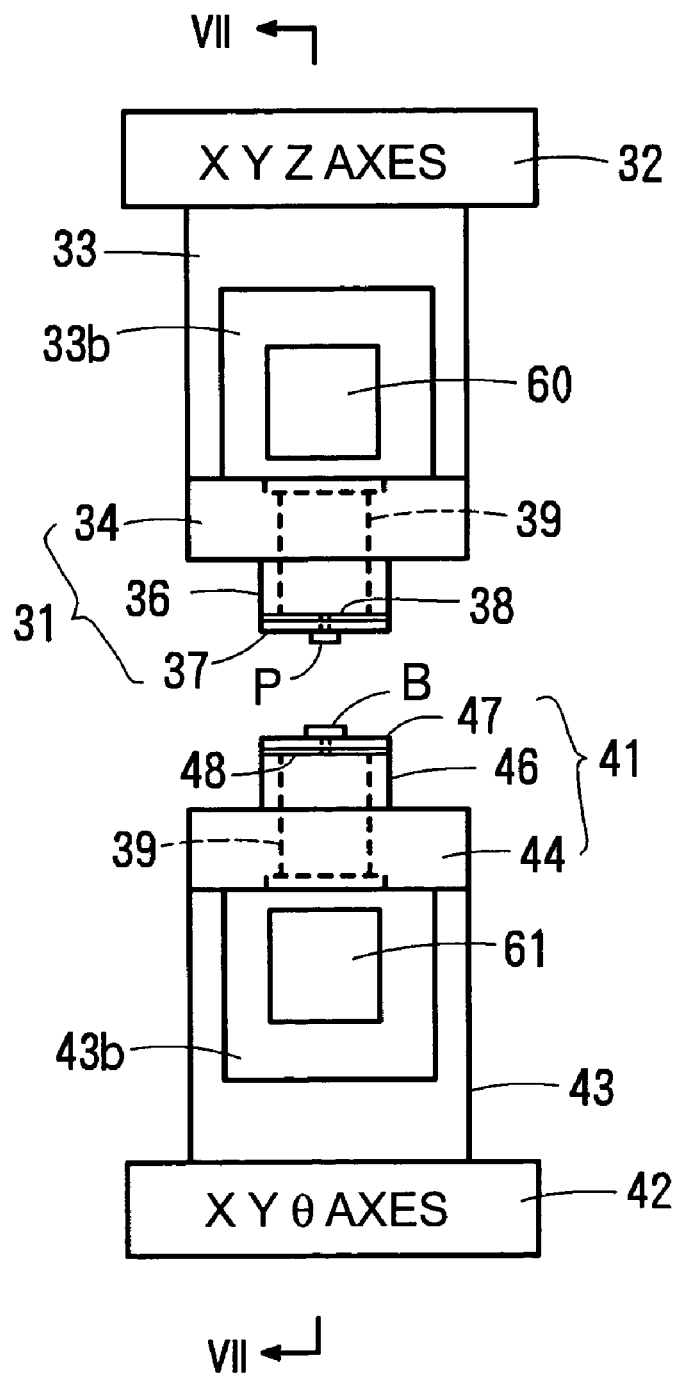
FIG. 6 is a frontal view of a mounting apparatus employing a parts mounting method of a second embodiment according to the present invention.
Figure 7:
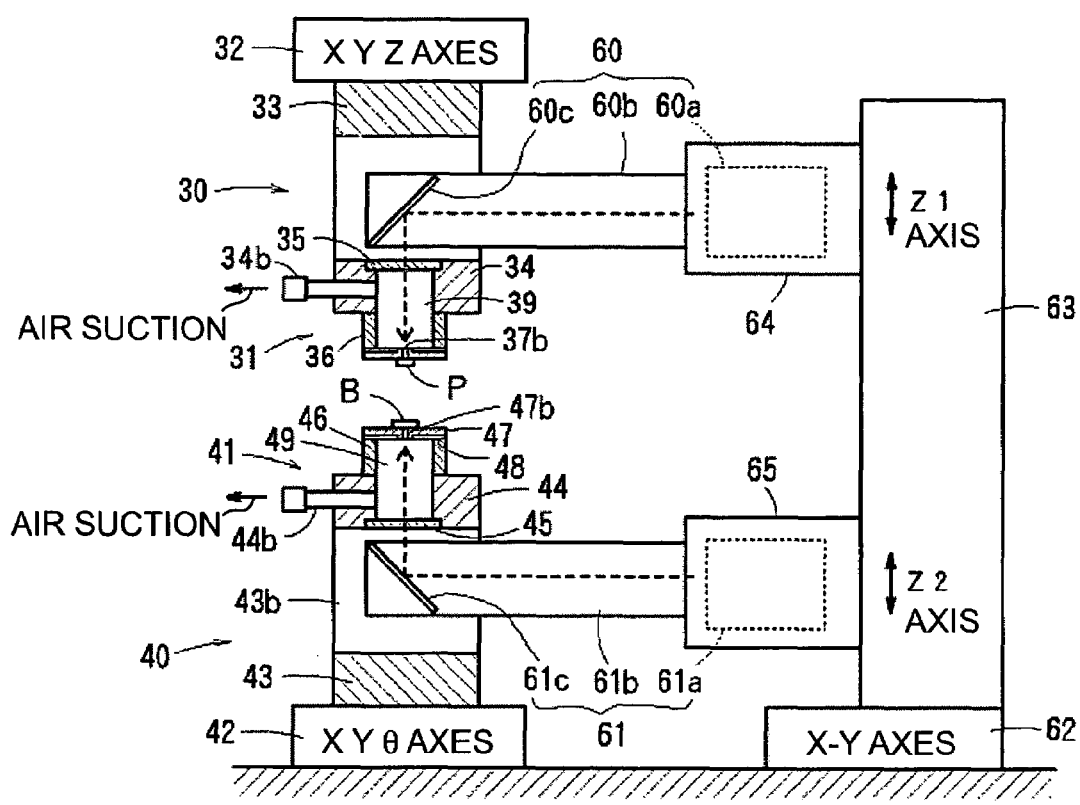
FIG. 7 is a cross-sectional view taken along line VII—VII in FIG. 6.

FIGS. 5A through 5F show another example of the operation of the above-described mounting apparatus. FIG. 5A shows calibration processing for the first camera 20 and the second camera 21, wherein a calibration mark 19 is provided to the stage 11. Accordingly, the first camera 20 and the second camera 21 are moved to the mounting position, the tip of the stage 11 is inserted between the camera 20 and the camera 21, and both the cameras 20 and 21 take images of the calibration mark 19 provided to the stage 11 so as to detect any offset of the optical axes of the cameras 20 and 21. FIG. 5B shows the state wherein the stage 11 is moved to the mounting position. Here, the first camera 20 takes an image of the board B (alignment mark B1) held on the stage 11, and the second camera 21 takes an image of the reference mark 14 provided on the lower face of the stage 11. The position of the board B and the relative position between the board B and the stage 11 are calculated based upon the image information from the first camera 20 and the second camera 21, and the calculated results are stored. FIG. 5C shows the state wherein, immediately following the stage 11 being moved to one side from the mounting position, the suction head 2 is moved to the mounting position. FIG. 5D shows the state of the suction head 2 being moved downwards to the mounting level, wherein the first camera 20 detects the head reference mark 5, and the second camera 21 detects the electronic part P (alignment mark P1), at the mounting position. That is to say, the position of the electronic part P and the relative position between the electronic part P and the suction head 2 are calculated based upon the image information from the first camera 20 and the second camera 21, and the calculated results are stored.

Note that, at this time, the focal distances of the first camera 20 and the second camera 21 are different from those at the time of detecting the calibration mark 19, and accordingly, the first camera 20 and the second camera 21 preferably have autofocus functions in order to clearly detect the head reference mark 5 and the alignment mark P1.

FIG. 5E shows the state wherein the suction head 2 is moved upward from the mounting level, and the stage 11 is moved to the mounting position. Here, the stage 11 is moved in the X, Y, and θ directions so that the position of the board B matches the position of the electronic part P shown in FIG. 5D based upon the positional information stored in processing shown in FIG. 5B. FIG. 5F shows mounting processing, wherein the suction head 2 is moved downwards so as to mount the electronic part P on the board B while keeping the stage 11 at the same position as in FIG. 5E. At this time, even in the event that the Z-axial driving mechanism 7 for the suction head 2 is moved without sufficient repeatability, the margin of error between the positions of the reference mark 5 in processing shown in FIG. 5D and FIG. 5F is detected, and furthermore, correction is performed in the X and Y directions based upon the detected margin of error, whereby positioning with sufficient precision can be performed. Thus, precise positioning is performed for the electronic part P and the board B, thereby performing mounting with high precision.

In the positioning process shown in FIGS. 4A–F and 5A–5F, in a case of mounting with heating, deformation of the suction head 2 or the stage 11 may be caused due to thermal expansion during mounting. Accordingly, even in the event that precise positioning has been performed immediately before mounting, precise matching might not be able to be performed for the electronic part P and the board B at the point in time that mounting has ended. As a countermeasure for the above-described problem, a method described below can be employed in the mounting processing (see FIG. 4F or FIG. 5F). First of all, the first and second cameras 20 and 21 detect the head reference mark 5 and the stage reference mark 14, respectively, and temporary positioning is performed for the suction head 2 and the stage 11 so that the position of the electronic part P matches the position of the board B based upon the above-described relative positional information. At this point in time, the electronic part P and the board B are only in soft contact with each other. Next, pressing is performed while heating one or both of the suction head 2 and the stage 11 (e.g., 350° C. for 5 seconds or more), and the first and second cameras 20 and 21 continuously take images of the head reference mark 5 and the stage reference mark 14 during pressing. During pressing, correction is performed for the suction head 2 and the stage 11 with regard to the relative position therebetween so that the suction head 2 and the stage 11 are kept at the same relative position as with the above-described temporary mounting. Thus, even in the event that deviation of the electronic part P occurs, the deviation is detected by the cameras 20 and 21 in real time, thereby enabling precise mounting of the electronic part P to be performed. Note that, while description has been made regarding an arrangement wherein temporary mounting is performed with the electronic part P and the board B being in soft contact with each other, an arrangement may be made wherein temporary mounting is performed with the electronic part P and the board B not being in contact with each other, but with a small gap therebetween.

Second Embodiment

FIGS. 6 through 9 shows a mounting apparatus of a second embodiment of the present invention. The mounting apparatus of the present embodiment comprises a head unit 30, a stage unit 40, first and second optical systems 60 and 61, and a control device (not shown), in the same way as with the first embodiment. The head unit 30 is made up of a suction head 31 for suctioning the electronic part P, a driving mechanism 32 for driving the suction head 31 in the X, Y, and Z directions, for example, and a bracket 33 for connecting the suction head 31 to the driving mechanism 32. The bracket 33 includes a pair of support walls 33a facing one another so as to define a hollow portion 33b therebetween, extending from one end to the other in the X-axial direction. A mirror portion 60c of the first optical system 60 is detachably inserted into the hollow portion 33b from the X-axial direction.

Figure 8A:
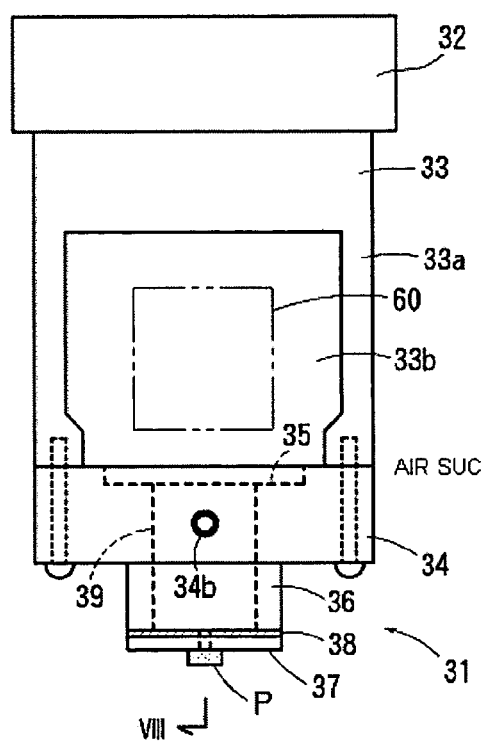
Figure 8B:
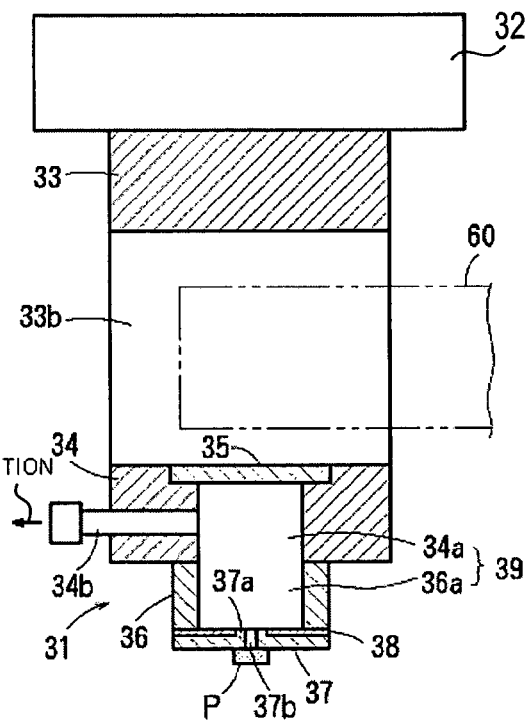

As shown in FIG. 8, the suction head 31 comprises a base member 34, a transparent plate 35 formed of a transparent glass or the like, secured to the upper face of the base member 34, a tube member 36 formed of a heat insulating material and secured to the lower face of the base member 34, an attachment member 37 secured to the lower portion of the tube member 36, and a heater 38 mounted between the attachment member 37 and the tube member 36. The aforementioned base member 34 is secured to the lower end portion of the support walls 33a with screws or the like. The attachment member 37 is preferably formed of a material with as excellent thermal conductivity as possible.

The base member 34 includes a hole 34a at the center portion thereof in the form of a through hole formed in the vertical direction, communicating with an internal hole 36a of the tube member 36, wherein the holes 34a and 36a form a hollow portion 39. The upper face of the hollow portion 39 is closed by the transparent plate 35. The base member 34 is connected to an air pipe 34b communicating with the hollow portion 39, wherein the air pipe 34b is connected to an unshown vacuum suction device, whereby an air suction path is formed.

The heater 38 includes a through hole 38a at the center portion thereof, wherein the through hole 38a is fitted to a hub portion 37a protruding at the center portion of the attachment member 37, and accordingly, the heater 38 is disposed in the shape of a concentric circle on the attachment member 37. A part-suction opening 37b is formed in the form of a through hole at the center portion of the hub portion 37a of the attachment member 37. The electronic part P is suctioned to the opening portion on the lower side of the part-suction opening 37b.

Figure 9A:
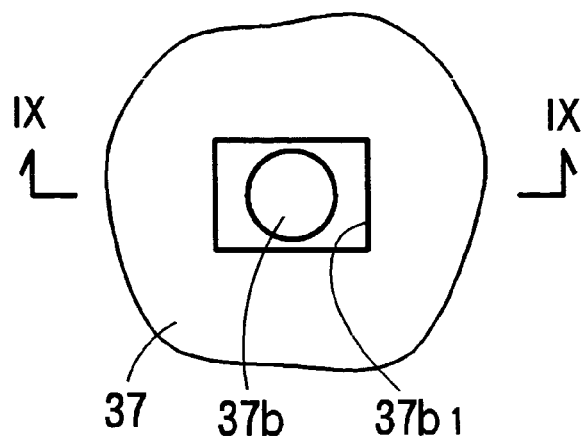
Figure 9B:
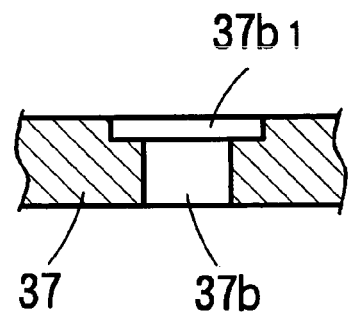

As described above, the hollow portion 39 communicating with the part-suction opening 37b is formed behind the part-suction opening 37b of the suction head 31, and the end of the hollow portion 39, opposite the part-suction opening 37b, is closed by the transparent plate 35. The bracket 33 for connecting the head 31 to the driving mechanism 32 includes the hollow portion 33b, wherein the part-suction opening 37b can be easily observed by the first optical system 60 inserted into the hollow portion 33b through the transparent plate 35. That is to say, the part-suction opening 37b can be employed as a head reference mark. Note that the opening 37b1 (FIG. 9) on the upper side of the part-suction opening 37b is preferably formed in a directive shape such as a rectangle or the like for in addition detecting the offset in angle in the rotational direction, as shown in FIG. 9.

The stage unit 40 comprises a stage 41 for suctioning and holding the board B, a driving mechanism for driving the stage 41 in the X, Y, and θ directions, for example, and a bracket 43 for connecting the stage 41 to the driving mechanism 42. The stage 41 has a vertically-symmetrical configuration as to the suction head 31 and the bracket 43 has a vertically-symmetrical configuration as to the bracket 33, and accordingly, description regarding corresponding portions will be omitted. That is to say, reference numeral 43b denotes a hollow portion, 44 denotes a base member, 44b denotes an air pipe, 45 denotes a transparent plate, 46 denotes a tube member, 47 denotes an attachment member, 47b denotes a part-suction opening, 48 denotes a heater, and 49 denotes a hollow portion. In this case, images of the part-suction opening 47b can be taken through transparent plate 45 by the second optical system 61 inserted into the hollow portion 43b from the X-axial direction, and accordingly, the part-suction opening 47b can be used as a head reference mark, as well.

The first optical system 60 is mounted to a support portion 63 provided on an XY-axial driving mechanism 62 through a Z1-axial driving mechanism 64, the second optical system 61 is mounted to the aforementioned support portion 63 through a Z2-axial driving mechanism 65. The first optical system 60 comprises a camera 60a, a tube-shaped lens 60b extending in the X-axial direction, and a prism or mirror 60c mounted to the end of the lens 60b, wherein the mirror 60c is inserted into the hollow portion 33b of the bracket 33. With the above-described configuration, light from the part-suction opening 37b is reflected by the mirror 60c so that the camera 60a can take an image of the part-suction opening 37b through the lens 60b. The second optical system 61 comprises a camera 61a, a tube-shaped lens 61b extending in the X-axial direction, and a prism or mirror 61c, with the mirror 61c being inserted into the hollow portion 43b of the bracket 43, in the same way. Note that the mirrors 60c and 61c have small cross-sectional areas as compared to the hollow portions 33b and 43b, and accordingly, the mirrors 60c and 61c are mounted with some leeway of space in the X, Y, and Z directions. Accordingly, even in the event that the suction head 31 and the stage 41 are moved at the time of positional detection, mounting, or correction of the position, any interference between the bracket 33 and the mirror 60c, and between the bracket 43 and the mirror 61c, can be prevented.

The first optical system 60 and the second optical system 61 are supported by the support portion 63 so that these optical systems face one another with aligned optical axes, and relative movement is not caused between these cameras in the X and Y directions. Furthermore, one of the part-suction openings 37b and 47b provided on the suction head 31 and the stage 41 may be used as a calibration mark in order to detect any offset of the optical axes of the first optical system 60 and the second optical system 61. Note that, in this case, there is the need to perform calibration with the electronic part P or the board B not being suctioned to the suction head 31 or the stage 41, as the case may be. Furthermore, the optical systems 60 and 61 can be integrally moved in the X and Y directions by the XY-axial driving mechanism 62 in order to handle processing for mounting multiple parts P on a large-sized board B. Furthermore, the first optical system 60 can be adjusted in the vertical direction by the Z1-axial driving mechanism 64, and the second optical system 61 can be adjusted in the vertical direction by the Z2-axial driving mechanism 65, thereby enabling independent focus adjustment for the optical systems 60 and 61.

The operation of the mounting apparatus of the above-described embodiment is generally the same as with the operation shown in FIGS. 4A through 4F and FIGS. 5A through 5F. Note that, in the event that the part-suction opening 37b of the suction head 31 or the part-suction opening 47b of the stage 41 is used for calibration, the suction head 31 or the stage 41 is inserted between the upper and lower optical systems 60 and 61 with the electronic part P or the board B not being suctioned so as to perform measurement of the offset of the optical axes.

With the above-described embodiment, the part-suction openings 37b and 47b are used as a head reference mark and a stage reference mark, respectively. The part-suction openings 37b and 47b are disposed at positions closest to the electronic part P and the board B, and accordingly, even in the event that some deformation of the suction head 31 or the stage 41 occurs, the relative positional offsets between the electronic part P and the suction head 31 and between the board B and the stage 41 are reduced to the minimal value. Furthermore, with the above-described embodiment, the part-suction opening serving as a reference mark can be observed through the transparent plate from the back of the head (or stage), and accordingly, precise position of the head (or stage) can be detected even during mounting, thereby enabling positioning with high precision.

Furthermore, the suction head 31 and the stage 41 include the heaters 38 and 48, respectively, and thus, the electronic part P can be mounted on the board B under heat and pressure during mounting processing. In this case, the heaters 38 and 48 are disposed at positions extremely close to the part-suction openings 37b and 47b, respectively, and heat is transmitted to the electronic part P and the board B with optimal efficiency, thereby improving bonding performance. On the other hand, in the event of heating the head (or stage), distortion occurs in the image taken from the optical system due to wavering of the surrounding air, leading to the occurrence of a margin of error. However, with the present embodiment, the hollow portion 39 is subjected to reduction of pressure by air suctioning from the air suctioning path, and accordingly, the density of air is reduced, whereby the wavering of the air is reduced. Thus, at the time of taking an image of the part-suction opening 37b through the transparent plate 35 and the hollow portion 39, the margin of error due to the wavering of air is reduced, thereby obtaining precise image data.

Note that, while description has been made regarding the above-described arrangement wherein the mirror portions 60c and 61c provided to the first optical system 60 and the second optical system 61 are inserted into the hollow portions 33b and 43b, respectively, in a case in which small-sized cameras can be employed, an arrangement may be made wherein the lens units 60b and 61b, and the mirror units 60c and 61c, are eliminated, and the cameras 60a and 61a are directly inserted into the hollow portions 33b and 43b, respectively. Furthermore, while description has been made regarding an arrangement wherein the suction head 31 and the stage 41 have a symmetrical configuration one to another with respect to the vertical direction, and the bracket 33 and the bracket 43 have a symmetrical configuration one to another with respect to the vertical direction, an arrangement may be made wherein any of the aforementioned components may have any arbitrary configuration according to the shape and the size of the first part (electronic part) P or the second part (board) B to be handled.

With the present embodiment, a support member having a configuration wherein support is performed with a pair of support walls 33a as described in the present embodiment is employed as each of the brackets 33 and 43, and accordingly, the suction head 31 and the stage 41 can be supported with a support configuration at both ends so as to be connected to the driving mechanisms 32 and 42, respectively, whereby distortion of the suction head 31 and the stage 41 due to application of pressure during mounting can be prevented. Furthermore, the brackets 33 and 43 have hollow portions 33b and 43b, respectively, where the mirror portions 60c and 61c of the optical systems 60 and 61 can be detachably inserted, and thus, the head reference marks 37b and 47b can be easily observed during mounting.

Third Embodiment

Figure 10:
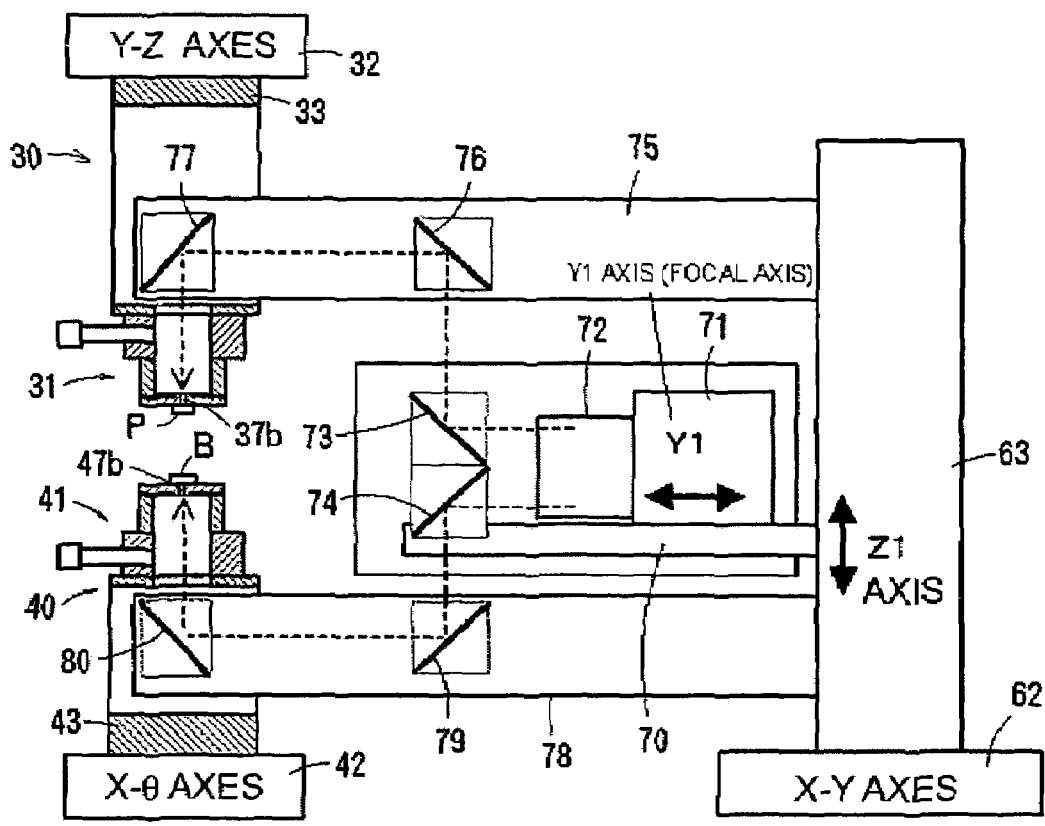
FIG. 10 is a side view of a mounting apparatus of a third embodiment according to the present invention.
Figure 11:
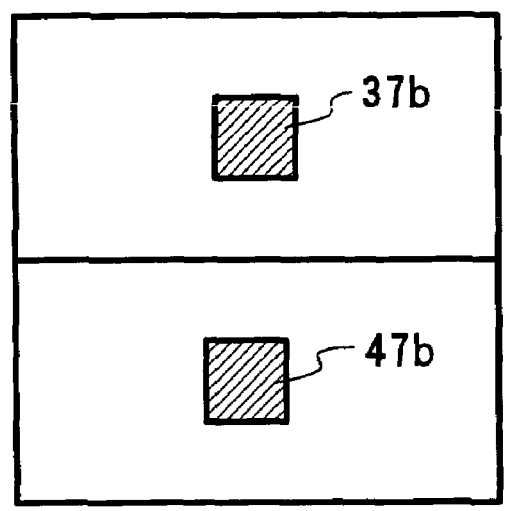
FIG. 11 is an image taken by a camera having a field of view shown in FIG. 10.

FIGS. 10 and 11 illustrate a mounting apparatus of a third embodiment according to the present invention, wherein two optical systems have a single camera. The same components as in the second embodiment shown in FIGS. 6 through 9 are denoted by the same reference numerals, and description thereof will be omitted. With the present embodiment, a camera 71, a lens 72, and mirrors (or prisms) 73 and 74 for dividing the field of view of the camera 71 into halves in the vertical direction are disposed on a table 70 provided to the support portion 63 so as to be movable in the Z-axial direction. The optical axis of the camera 71 is bent upwards by the mirror 73, and is bent downwards by two mirrors (or prisms) 76 and 77 provided in an upper optical system 75 which cannot be moved in the Z-axial direction, whereby the camera 71 can take an image of the head reference mark 37b. On the other hand, the optical axis is bent downwards by the mirror 74 and then is bent upwards by two mirrors (or prisms) 79 and 80 provided in a lower optical system 78 which cannot be moved in the Z-axis direction, whereby the camera 71 can take an image of the stage reference mark 47b. Thus, two optical systems can be formed with the single camera 71.

FIG. 11 shows an image example taken by the camera 71 having above-described field of view. The upper-half image corresponds to the head reference mark 37b, and the lower-half image corresponds to the stage reference mark 47b. The table 70 is moved in the Z-axial direction so that the optical path lengths of the upper and lower optical systems match one another, and furthermore, the focus of the camera 71 is adjusted by focusing in the Y-axial direction, whereby focusing can be performed for the images coming from the upper and the lower optical systems at the same time.

Fourth Embodiment

Figure 12:
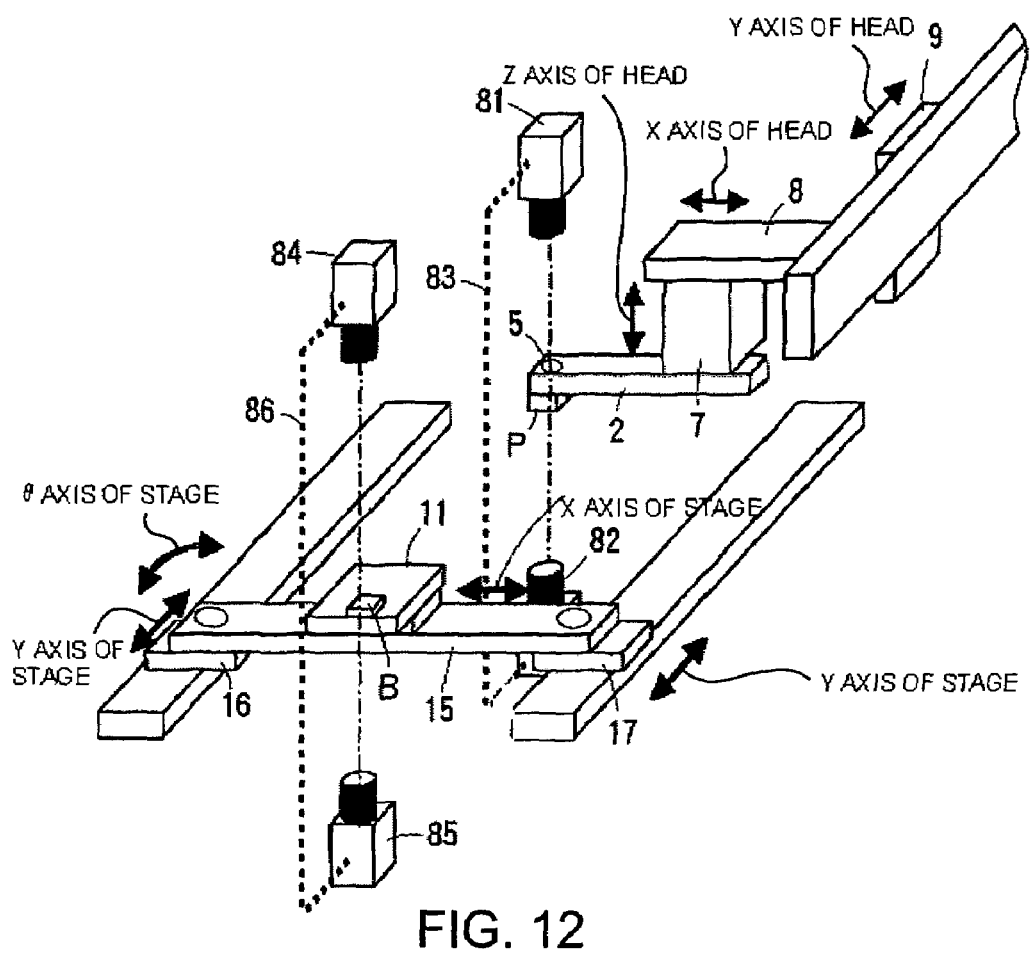
FIG. 12 is a perspective view of a mounting apparatus of a fourth embodiment according to the present invention.

FIGS. 12 and 13 illustrate a mounting device of a fourth embodiment according to the present invention. With the present embodiment, four cameras are employed in order to perform positioning in a short time. Description will be made below with reference to FIGS. 12 and 13, while making a comparison with FIGS. 1 and 4, respectively. Note that the same components are denoted by the same reference numerals, and description thereof will be omitted. In FIG. 12, a first camera 81 and a second camera 82 are held by a suitable positioning arrangement 83 so that these cameras face one another with aligned optical axes, and a third camera 84 and a fourth camera 85 are held by another positioning arrangement 86 so that these cameras face one another with aligned optical axes. For example, the first camera 81 is used for detecting the head reference mark 5, and the second camera 82 is used for detecting the electronic part P suctioned by the suction head 2. Furthermore, the third camera 84 is used for detecting the board B held by the stage 11 and the head reference mark 5, for example, and the fourth camera 85 is used for detecting the stage reference mark 14. The relative positions between the first camera 81 and the second camera 82, and between the third camera 84 and the fourth camera 85, cannot be changed in the X and Y directions, although relative movement therebetween is possible in the focus direction.

Description will be made regarding the operation of the above-described mounting apparatus with reference to FIGS. 13A through 13D. FIG. 13A shows the calibration process, wherein the tip of the suction head 2 is inserted between the first camera 81 and the second camera 82, and both the cameras 81 and 82 take images of the calibration mark 6 provided to the suction head 2, whereby the offset of the optical axes of the cameras 81 and 82 is obtained. In the same way, the stage 11 is inserted between the third camera 84 and the fourth camera 85, and both the cameras 84 and 85 take images of the calibration mark 19 provided to the stage 11, whereby the offset of the optical axes of the cameras 84 and 85 is obtained. FIG. 13B shows the state wherein the electronic part P suctioned to the suction head 2 is inserted between the cameras 81 and 82, and the board B held by the stage 11 is inserted between the cameras 84 and 85. In this situation, the relative position between the head reference mark 5 and the electronic part P is detected by the cameras 81 and 82, and the relative position between the board B and the stage reference mark 14 is detected by the cameras 84 and 85. FIG. 13C shows the state wherein the suction head 2 and the stage 11 are moved so that positions of the electronic part P and the board B match one another. While description will be made regarding an arrangement wherein the suction head 2 is moved to a position between the third and fourth cameras 84 and 85 so that the third camera 84 detects the head reference mark 5, and so that the fourth camera 85 detects the stage reference mark 14, an arrangement may be made wherein the stage 11 is moved to a position between the first and second cameras 81 and 82 so that the first camera 81 detects the head reference mark 5, and so that the second camera 82 detects the stage reference mark 14. FIG. 13D shows the bonding process wherein bonding is performed while heating the electronic part P and the board B.

An arrangement is preferably employed wherein the third and fourth cameras 84 and 85 continuously take images of the marks 5 and 14 so as to adjust the positioning of the suction head 2 or the stage 11 in real time so that deviation of the electronic part P from the board B due to heating does not occur.

As described above, with the present embodiment, the four cameras 81, 82, 83, and 84 are employed, and accordingly, one pair of cameras can take images of the components of the suction head 2 while the other pair of cameras take images of the components of the stage 11, thereby enabling positioning and mounting in a short time.

Figure 14:
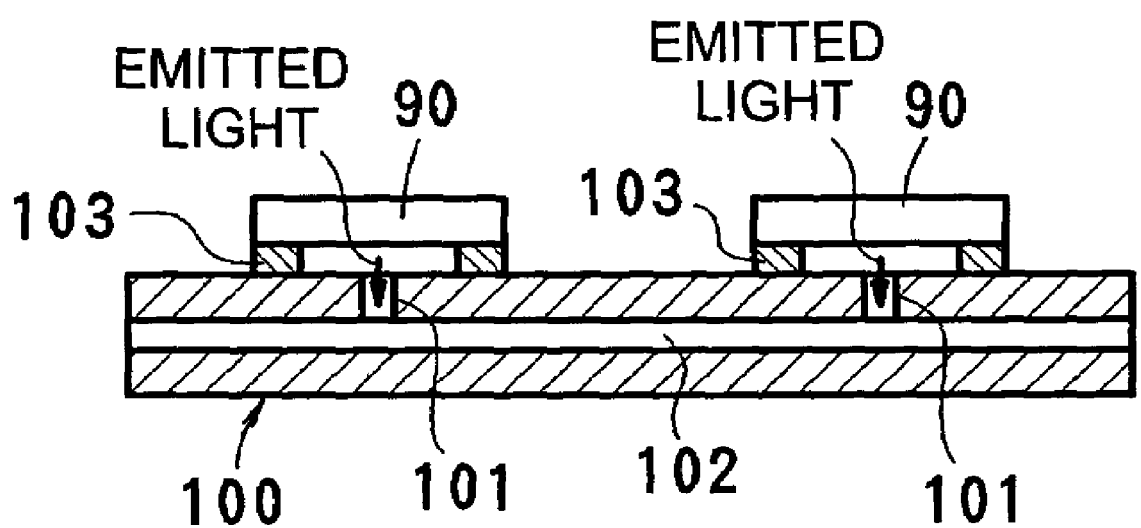
FIG. 14 is a cross-sectional diagram which illustrates an optical device wherein mounting has been performed with the parts mounting method according to the present invention.
Figure 15:
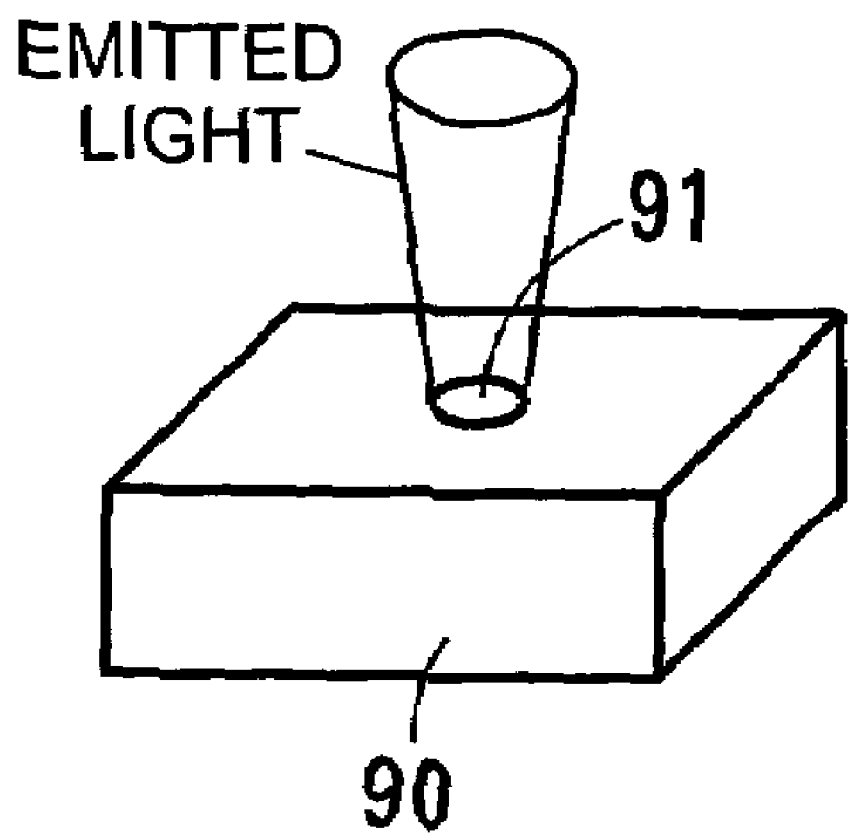
FIG. 15 is a perspective view of a laser diode used as the optical device in FIG. 14.

FIGS. 14 and 15 show examples of optical devices manufactured with the parts mounting method according to the present invention. With the present example, a VCSEL (Vertical Cavity Surface Emitting Laser) diode 90 (which will be referred to as an "LD" hereafter) is used as a first part, and an optical waveguide substrate 100 is used as a second part. As shown in FIG. 15, the LD 90 has an emission portion 91 at the center portion on the main face thereof, from which a generally-conical emitted light beam is cast. On the other hand, in the upper face of the optical waveguide substrate 100, light-introducing openings 101 are formed in the vertical direction at predetermined intervals, and waveguides 102 are formed inside the substrate 100 in the horizontal direction, orthogonal to the light-introducing openings 101. The LD 90 is bonded onto the upper face of the optical waveguide substrate 100 with electroconductive bonding members (metal bonding member) 103 with the bottom up, and with the positions of the light-introducing opening 101 and the emission portion 91 matching one another. The light emitted from the LD 90 is transmitted to an unshown optical communication circuit from the light introducing openings 101 through the waveguides 102.

In a case in which bonding is to be performed for the above-described LDs 90 and optical waveguide substrate 100 with precise position-matching, a mounting method according to the present invention is preferably employed. While description has been made regarding an arrangement in the first and second embodiment wherein alignment marks P1 and B1 are each provided to the first part P and the second part B, with the third embodiment, the emission portion 91 of the LD 90 can be used as an alignment mark, and the light-introducing opening 101 of the optical waveguide substrate 100 can be used as an alignment mark, as well. Accordingly, there is no need to provide any specific alignment mark to the LD 90 or the optical waveguide substrate 100. In particular, with the LD 90, the position of the emission portion 91 is important. Note that, even in a case of providing a specific alignment mark at a position other than the emission portion, in the event that margin of error occurs between the alignment mark and the emission portion, precise mounting of the LD 90 onto the optical waveguide substrate 100 cannot be performed. As described above, the emission portion 91 and the light-introducing opening 101 are used as alignment marks, and thus, not only are the mounting operations reduced, but also mounting can be performed with improved precision.

While description has been made regarding an arrangement in the above-described embodiments wherein one electronic part P is mounted onto one board B, the present invention also can be applied to an arrangement wherein multiple electronic parts P are mounted onto one board B in the same way. Note that, in this case, it is preferable to provide respective alignment marks B1 to multiple mounting positions of the board B, and it is also preferable to provide multiple respective stage reference marks 14 to the corresponding positions on the stage 11.

The present invention can be applied to various uses such as a chip mounter for mounting electronic devices such as semiconductor chips or the like onto a board, TAB bonder, flip-chip bonder, and the like.

The configuration of the parts-mounting apparatus according to the present invention is not restricted to any of the configurations shown in FIGS. 1 through 13. For example, an arbitrary configuration may be employed for carrying out the process according to the present invention.

While description has been made regarding an arrangement according to the present invention wherein the first camera is disposed above the suction head, and the second camera is disposed below the stage, the present invention is not restricted to this arrangement, but rather, some of the portions for receiving light (e.g., lens, mirror, or the like) may be disposed above the suction head, and other portions for receiving light may be disposed below the stage, i.e., there is no need to dispose a pair of main camera units respectively above the suction head and below the stage. Thus, an arrangement may be made wherein light is cast onto a pair of main camera units disposed above, beside or below the suction head, or above, beside or below the stage, using multiple mirrors or prisms.

Although the present invention has been described in relation to particular embodiments thereof, many other variations and modifications and other uses will become apparent to those skilled in the art. Therefore, the present invention is not limited by the specific disclosure herein.

What is claimed is:

1. A parts mounting apparatus for positioning and mounting a first part and a second part, said apparatus comprising:
   a suction head, having a head reference mark which can be observed from above, for suctioning said first part at a lower end portion of said suction head;
   a stage, having a stage reference mark which can be observed from below, for holding a second part at an upper end portion of said stage;
   a driving mechanism for relatively moving said suction head and said stage in X, Y, Z, and θ directions;

a first optical system for taking images of said second part held by the stage, and said head reference mark, from above said suction head;

a second optical system, disposed so as to generally face said first optical system with the optical axis thereof aligned with the optical axis of said first optical system, for taking images of said first part suctioned to said suction head, and said stage reference mark, from below said stage;

a computation device for calculating the relative position between said first part and said suction head, and the relative position between said second part and said stage, based upon image information from said first and second optical systems; and a control device for performing positional correction for said suction head and said stage so that the positions of said first part and said second part satisfy a predetermined relation based upon said positional information and said relative positional information from said first and second optical systems detecting said head reference mark, and stage reference mark with said suction head and stage being positioned at the mounting position.

2. A parts mounting apparatus according to claim 1, further comprising a positioning arrangement for continuously holding said first optical system and said second optical system in a fixed relation, at least when said images are taken and at least until said suction head and stage are at said mounting position.

3. A parts mounting apparatus according to claim 1, wherein
at least one of said suction head and said stage includes a part-suction opening; a hollow portion provided behind a back side of said part-suction opening and communicating with said part-suction opening; a transparent member, which closes the end opposite said part-suction opening of said hollow portion, whereby the part-suction opening can be observed from the back side through said transparent member; and an air suction path connected to said hollow portion, and wherein at least one of said first optical system and said second optical system detects said part-suction opening as said head reference mark or said stage reference mark through said transparent member.

4. A parts mounting apparatus according to claim 3, wherein a heater is fixed near said part-suction opening.

5. A parts mounting apparatus according to claim 3, wherein the back side of said suction head or said stage is mounted to said driving mechanism by a bracket including a hollow portion, whereby said first or second optical system can be inserted for taking images of said part-suction opening through said transparent member.

* * * * *